United States Patent [19]

Nelson

[11] Patent Number: 5,369,648
[45] Date of Patent: Nov. 29, 1994

[54] BUILT-IN SELF-TEST CIRCUIT

[75] Inventor: Robert W. Nelson, Stillwater, Minn.

[73] Assignee: NCR Corporation, Dayton, Ohio

[21] Appl. No.: 789,553

[22] Filed: Nov. 8, 1991

[51] Int. Cl.[5] ............... G01R 31/28; G06F 11/00
[52] U.S. Cl. .................... 371/27; 371/22.5; 371/15.1; 364/717
[58] Field of Search .......... 371/27, 22.5, 22.1, 371/15.1; 364/717

[56] References Cited

U.S. PATENT DOCUMENTS

| | | | |
|---|---|---|---|
| 3,961,252 | 6/1976 | Eichelberger | 324/73 AT |
| 4,513,418 | 4/1985 | Bardell, Jr. et al. | 371/25 |
| 4,670,877 | 6/1987 | Nishibe | 371/15 |
| 4,688,223 | 8/1987 | Motika et al. | 371/27 |
| 4,701,916 | 10/1987 | Naven et al. | 371/15 |
| 4,701,920 | 10/1987 | Resnick et al. | 371/25 |
| 4,801,870 | 1/1989 | Eichelberger et al. | 324/73 R |
| 4,870,346 | 9/1989 | Mydill et al. | 324/73 R |
| 4,959,832 | 9/1990 | Bardell, Jr. | 371/27 |
| 5,029,171 | 7/1991 | Lee et al. | 371/27 |
| 5,043,988 | 8/1991 | Brglez et al. | 371/27 |
| 5,144,571 | 9/1992 | Thong | 364/721 |

Primary Examiner—Robert W. Beausoliel, Jr.
Assistant Examiner—Ly V. Hua
Attorney, Agent, or Firm—James M. Stover

[57] ABSTRACT

An input register for an integrated circuit, the input register including a linear feedback shift register (LFSR) connected between the IC input pads and the user logic internal to the IC. The LFSR is configured as a polynomial function generator to provide a series of pseudo random test patterns to the IC internal logic. The output of the LFSR is also provided to a compare/weights logic circuit which (1) generates a stop count signal upon the receipt of a predetermined bit pattern from the LFSR, (2) generates a plurality of weighting signals by combining selected bits from the output of the LFSR, and (3) selects the feedback signal which is provided to the LFSR to determine the characteristic polynomial and degree of the polynomial implemented by the LFSR.

4 Claims, 7 Drawing Sheets

BUILT-IN SELF-TEST CIRCUIT

The present invention relates to apparatus for testing integrated circuit devices and, more particularly, to an improved Built-In Self-Test (BIST) circuit for integrated circuit devices.

BACKGROUND OF THE INVENTION

Improvements in integrated circuit (IC) design, materials and manufacturing technologies now permit the manufacture of Very Large Scale Integrated (VLSI) circuits containing hundreds of thousands of functional circuit elements. As these technologies continue to develop, higher levels of integration and greater circuit densities are expected. While higher levels of integration provide many significant advantages, e.g. reduction of product costs, reduced product weight and size, increased product sophistication, lower energy consumption and operating costs, increased reliability, etc., the functional testing of VLSI circuits has become an increasingly complex process. Testing costs are becoming a significant portion of total IC manufacturing costs.

Several methods have been developed to simplify and reduce the cost of testing integrated circuits (ICs). One method utilizes a pseudo random pattern generator (PRPG) to generate test patterns which are applied to the IC under test. The PRPG, unlike a binary counter, produces a succession of binary test patterns wherein the ratio between binary ones and binary zeros is 1:1 for a substantial number of successive test patterns. The use of pseudo random test patterns considerably reduces the number of patterns needed to test a device.

Another testing method applies a weighted random test pattern to the IC under test. This procedure provides a statistically predetermined greater number of binary ones or binary zeros to the IC under test. Emphirical studies have shown that weighted random pattern testing can significantly increase test pattern coverage to maximize the effect on the IC internal circuitry when compared with unweighted random pattern testing.

A further discussion of pseudo random pattern testing and weighting is provided by Eichelberger et al. in U.S. Pat. No. 4,801,870.

Further simplification and reduction in costs are obtained by implementing testing techniques through the use of Built-In Self-Test (BIST) circuits fabricated into VLSI circuit chips during manufacture. A BIST test access port and boundary scan architecture for digital integrated circuits is described in IEEE Standard 1149.1, incorporated herein by reference. This standard defines the design and operation of various design-for-test features built into ICs and sets forth a standard instruction set for executing self-test functions.

Although the test methodologies and BIST structures developed in recent years have simplified testing of integrated circuits, there exists a continuing need for improved testing techniques as IC circuit densities and levels of integration continue to increase.

OBJECTS OF THE INVENTION

It is therefore an object of the present invention to provide a new and useful built-in self-test feature for an integrated circuit device.

It is another object of the present invention to provide a built-in self-test circuit having a simplified construction.

It is yet another object of the present invention to provide a new and useful input register for an integrated circuit.

It is another object of the present invention to provide such an input register which provides built-in self-test functionality.

It is still a further object of the present invention to provide such an input register which includes a pseudo random pattern generator.

A still further object of the present invention is to provide such an input register which also includes a weighted signal generator.

It is an additional object of the present invention to provide a new and useful input register for an integrated circuit including a programmable polynomial function generator.

SUMMARY OF THE INVENTION

There is provided, in accordance with the present invention, an input register for an integrated circuit, the input register comprising a linear feedback shift register (LFSR) connected between the IC input pads and the user logic internal to the IC. The LFSR is configured as a pseudo random pattern generator to provide a series of pseudo random data patterns to the IC internal logic. The output of the LFSR is also provided to a compare/weights logic block including logic for generating a stop count signal upon the receipt of a predetermined bit pattern from the LFSR and logic for combining selected bits from the output of the LFSR to generate a plurality of weighting signals, each weighting signal having a known probability of being in a logic-one state.

In the described embodiment, the pseudo random pattern generator can also function as a multiple input signature register used to compress multiple test responses into a single signature, or as a counter. The counting function is achieved by inserting a previously determined starting seed into the LFSR and running the LFSR until the stop count bit pattern, an all-ones bit pattern, has occurred.

The above and other objects, features, and advantages of the present invention will become apparent from the following description and the attached drawings wherein applicable reference numerals have been carried forward.

DETAILED DESCRIPTION OF THE PREFERRED EMBODIMENT

Figure 1:
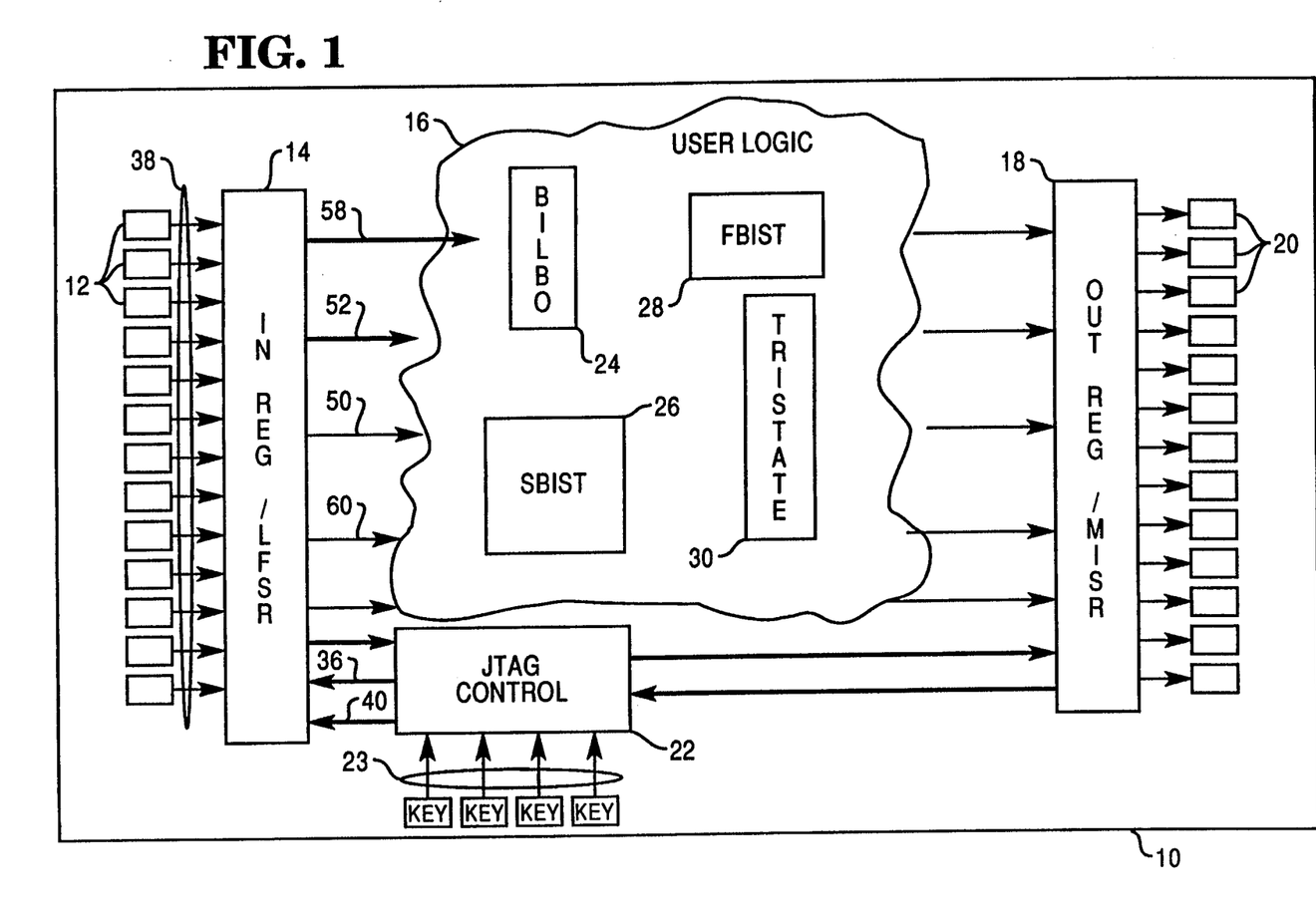
FIG. 1 is a diagram illustrating an integrated circuit (IC) device including boundary-scan registers connected between the IC input and output pads and the internal chip logic.

FIG. 1 illustrates an integrated circuit (IC) device 10 including an implementation of the BIST test access port and boundary scan architecture defined in IEEE Standard 1149.1. The architecture includes boundary-scan registers connected between the IC input and output pads and the internal chip logic 16. A boundary-scan input register 14 connected between the IC input pads 12 and internal chip logic block 16 is responsible for controlling any signal that enters the chip logic block from pads 12. An output register 18 connected between the chip logic block and the IC output pads 20 provides control over all signals that leave logic block 16.

Boundary-scan registers 14 and 18 provide selective isolation of internal logic block 16 from the external circuitry connected to input and output pads 12 and 20. In addition, the boundary-scan registers contain a good portion of the integrated circuit's BIST structure. Functional blocks 24, 26, 28 and 30 show additional BIST functionality which may be included within internal logic block 16, e.g. Built-In Logic Block Observer (BILBO) 24, Scan BIST (SBIST) 26, Functional BIST (FBIST) 28, and tristate control 30.

Control of the architecture described above is provided by means of JTAG control logic block 22. Control block 22 translates test commands, test data and control signals conveyed along a four-wire test bus 23 into the appropriate on-chip control signals for the BIST system structures.

Figure 2:
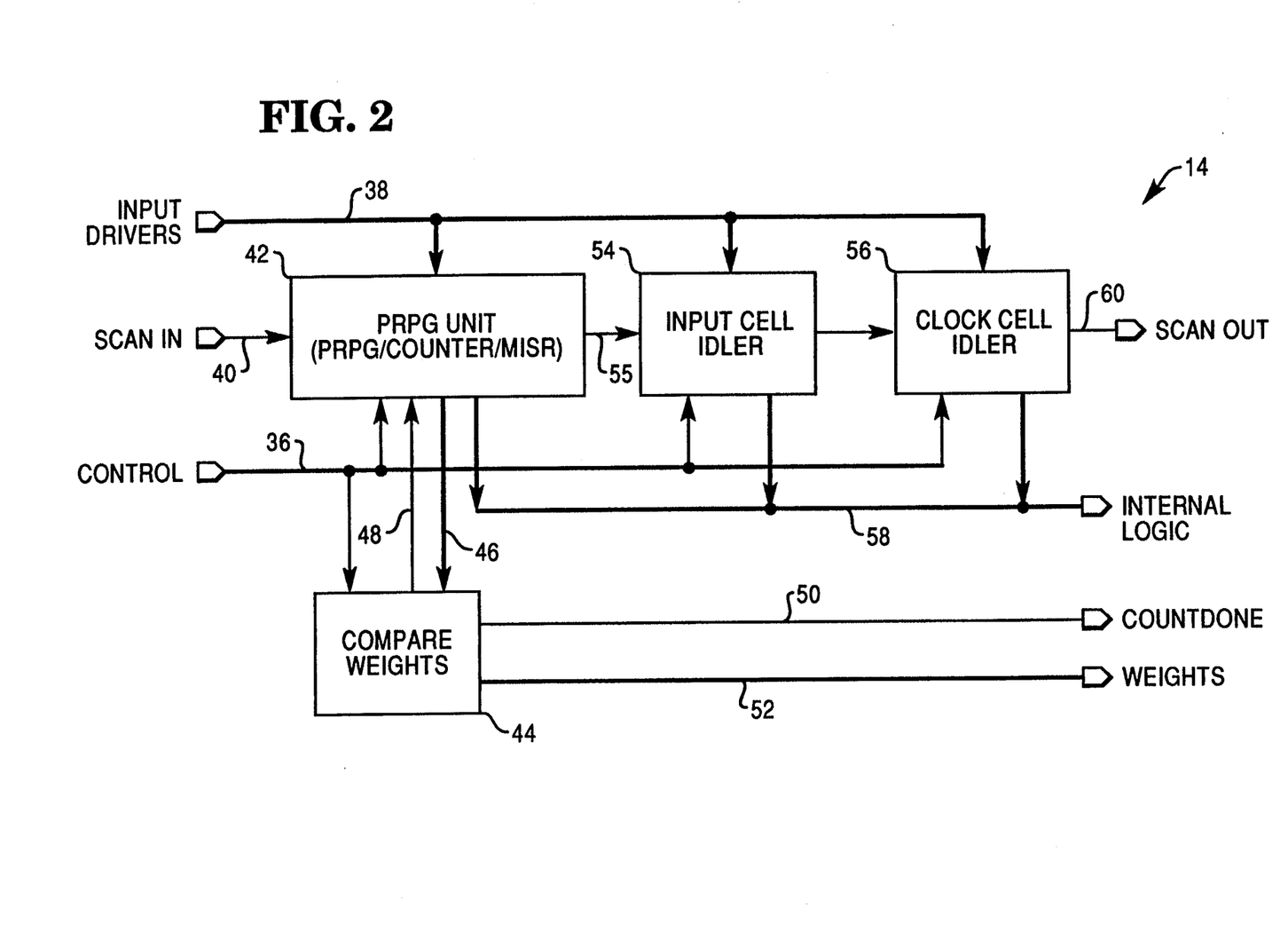
FIG. 2 is a block diagram illustration of a boundary-scan input register representing a preferred embodiment of the present invention.

The present invention concerns input register 14, a preferred embodiment of which is shown in block diagram form in FIG. 2. In response to various control signals provided by bus 36 the register may be configured to (1) generate random test patterns, (2) operate as a multiple input signature register, (3) capture incoming signals provided to the input register in either parallel form from the input pads via bus 38 or in serial form from line 40, (4) shift captured values through the register, or (5) count for a desired number of BIST cycles.

Input register 14 is shown divided into four major logic blocks: PRPG unit 42, compare/weights unit 44, input cell idler 54 and clock cell idler 56. PRPG unit 42 is composed of boundary scan input cells 62, shown in FIGS. 3 and 4, connected to form a Linear Feedback Shift Register (LFSR) that will implement one of three primitive polynomials:

$$p_1(x) = x^{53} + x^6 + x^2 + x + 1,$$

$$p_2(x) = x^{41} + x^6 + x^2 + x + 1,$$

or $$p_3(x) = x^{31} + x^6 + x^2 + x + 1,$$

to determine the pseudo random pattern input signal sequence.

Figure 5A:
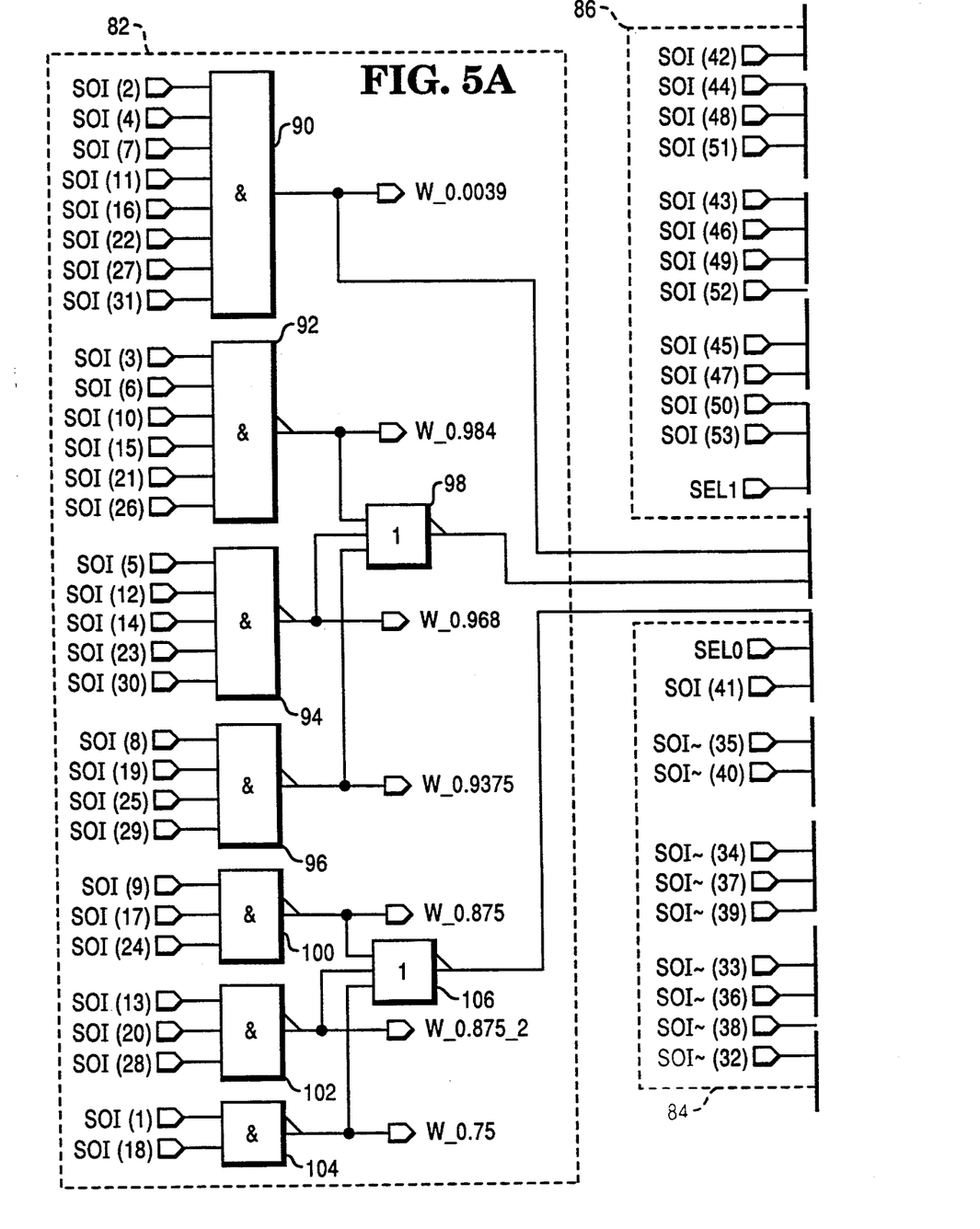
FIGS. 5A and 5B provide a schematic diagram of the compare/weights circuit shown in FIG. 2.
Figure 5B:
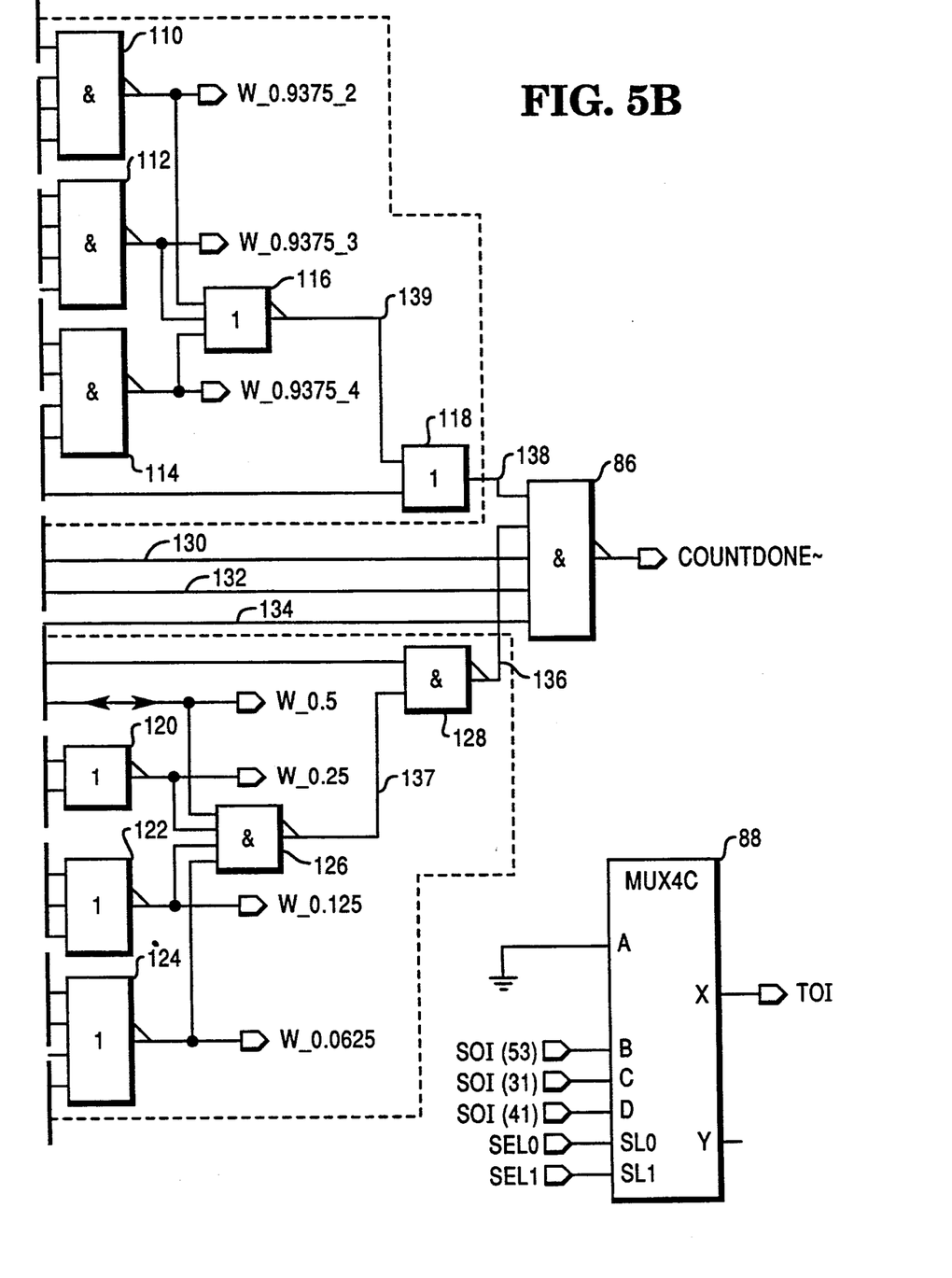

Compare/weights unit 44 contains the control logic which determines when pattern generation has been completed, generating a low COUNTDOWN signal when the value provided by the LFSR via bus 46 is all ones. The compare/weights unit also includes logic to create weighted signals which are made available for use by the BIST logic and the controlling logic to select the primitive polynomial implemented by the PRPG. FIGS. 5A and 5B and the accompanying discussion further describe the construction and operation of compare/weights unit 44.

Input cell idler 54 (FIG. 2) and clock cell idler 56 are composed solely of boundary-scan cells and are used to control input signals that are in excess of the capabilities of PRPG unit 42.

Table 1, provided below, lists and describes the control signals received by the input register.

TABLE 1

| Name | Input Register signal description Description |
|---|---|
| ED | Gates system data |
| ES | Gates serial test |
| TCK | IEEE 1149.1 test |
| SEL0 | Select LFSR for random pattern generation |
| SEL1 | |
| UE | Update latch |
| FB | Gates feedback |
| MX | Mode select |

A truth table setting forth the functions performed by the input register in response to the above-described control signals is provided below.

TABLE 2

| Input Register truth table | | | | | | | | |
|---|---|---|---|---|---|---|---|---|
| ED | ES | TCK | SEL0 | SEL1 | UE | FB | MX | Function |
| — | — | — | — | — | — | — | 0 | Pass Through |
| — | — | — | — | — | — | — | 1 | Parallel Output |
| — | — | — | — | — | — | — | — | No Change |
| 1 | 0 | — | — | — | — | — | 0 | Capture |
| 0 | 1 | — | 0 | 0 | — | 0 | — | Shift |
| 0 | 1 | — | 0 | 1 | — | 1 | — | LFSR length 31 |
| 0 | 1 | — | 1 | 1 | — | 1 | — | LFSR length 41 |
| 0 | 1 | — | 1 | 0 | — | 1 | — | LFSR length 53 |
| 1 | 1 | — | 0 | 1 | — | 1 | 0 | MISR length 31 |
| 1 | 1 | — | 1 | 1 | — | 1 | 0 | MISR length 41 |
| 1 | 1 | — | 1 | 0 | — | 1 | 0 | MISR length 53 |
| 0 | 0 | — | — | — | — | — | — | Reset |
| 1 | 0 | — | — | — | — | — | 1 | Feedback |

Figure 3:
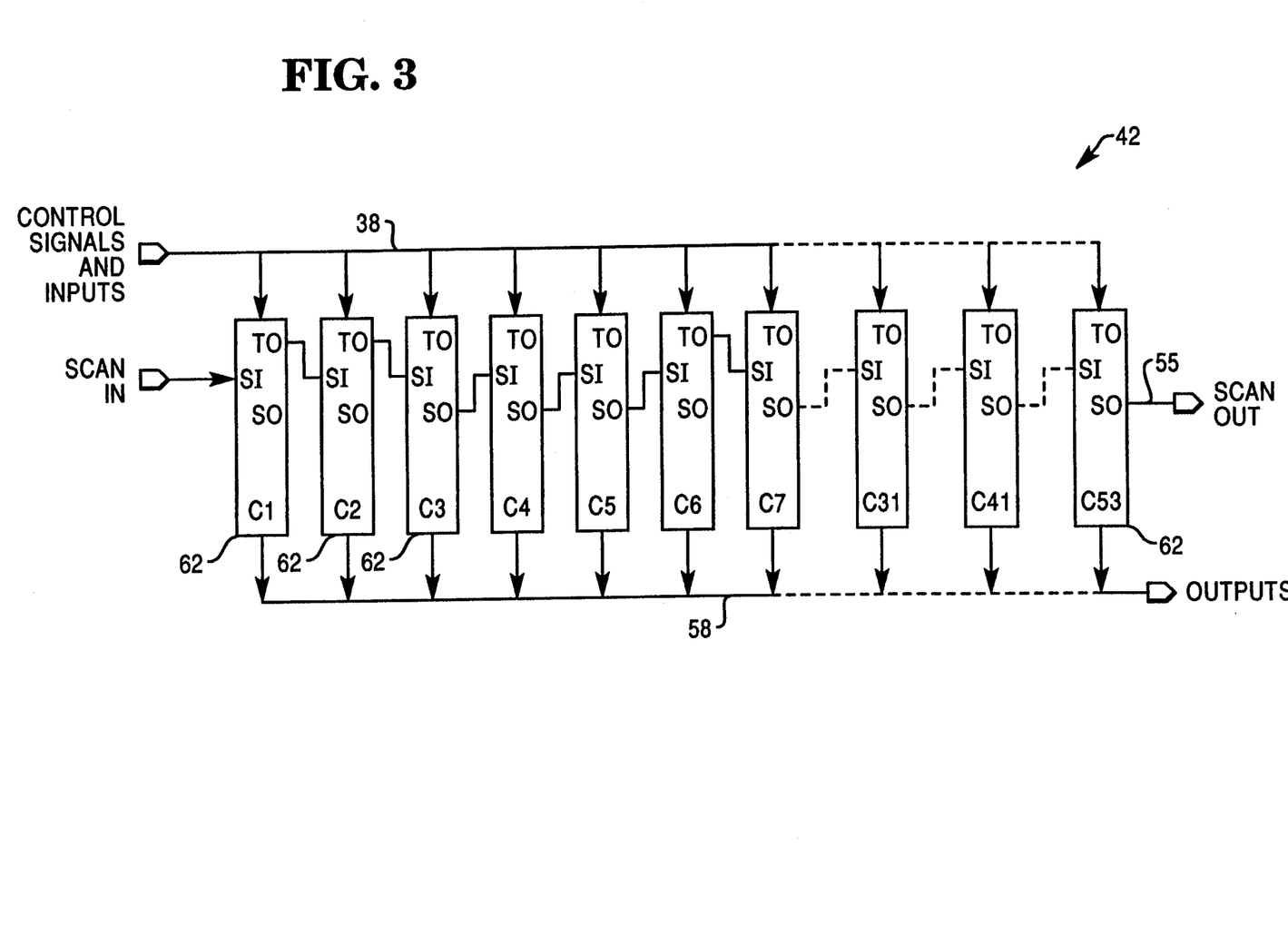
FIG. 3 is a block diagram illustration of the Pseudo Random Pattern Generating (PRPG) unit shown in FIG. 2.
Figure 4:
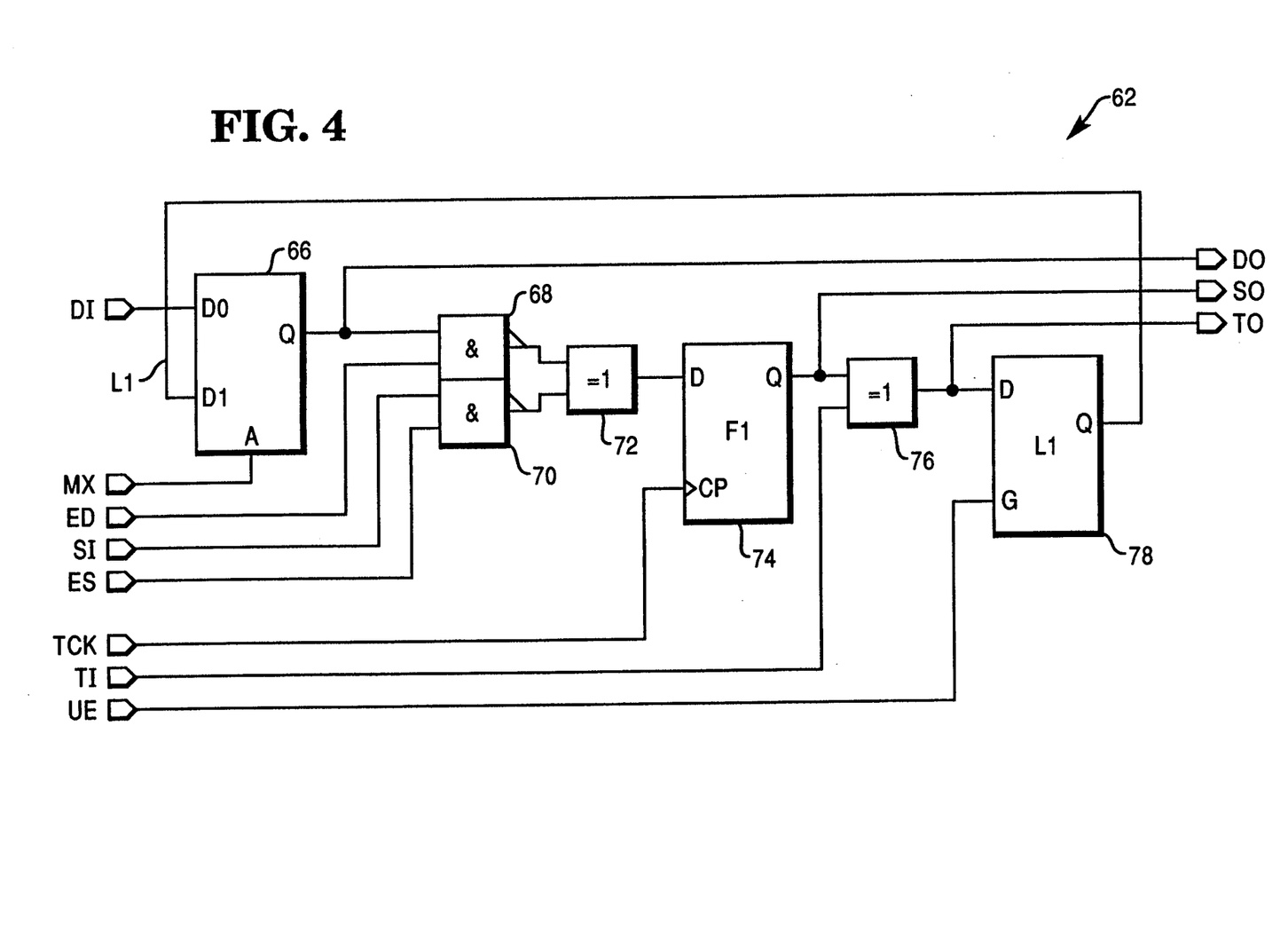
FIG. 4 shows the circuitry internal to each of the input cells included within the PRPG unit of FIG. 3.

FIG. 3 provides a block diagram illustration of the Pseudo Random Pattern Generating (PRPG) unit shown in FIG. 2. The PRPG unit consists of fifty-three connected standard input boundary cells 62. The cells are identified individually by reference numerals C1 through C53. The circuitry internal to each one of input boundary cells 62 is shown in FIG. 4. As shown in FIG. 4, boundary-scan input cell 62 includes a two-input multiplexer 66 connected to receive data signal DI from one of the chip input pads, feedback signal L1, and control signal MX. The signal provided at the output of multiplexer 66 forms one output signal, data output signal DO, of the boundary-scan input cell.

The output of multiplexer 66 is also connected to one input of a NAND gate 68. Control signal ED is also provided to NAND gate 68. A second NAND gate 70 is connected to receive serial test data input signal SI and control signal ES. The output signals of gates 68 and 70 are combined by an exclusive-OR gate 72, and provided to the input of a D-type flip-flop 74. The signal provided at the Q output of flip-flop 74 is identified as serial test data output signal SO.

Signal SO is combined by a second exclusive-OR gate 76 to form boundary-scan input cell output signal TO. Signal TO is also provided to a latch 78, which generates feedback signal L1.

Table 3, provided below, describes the input and output signals for boundary-scan input cell 62 shown in FIG. 4.

TABLE 3

Boundary-scan input cell signal description

| Name | Description |
| --- | --- |
| DI | System data input |
| ED | Gates system data |
| SI | Serial test data input |
| ES | Gates serial test data |
| TCK | IEEE 1149.1 test clock |
| TE | Test clock enable |
| TI | Tap input for LFSR |
| UE | Update latch enable |
| MX | Mode select |
| DO | System data output |
| SO | Serial test data |
| TO | Tap output for LFSR |

The functions performed by the input register in response to the above-described control signals are identified in the truth table, Table 4, which follows.

TABLE 4

Boundary-scan input cell truth table

| DI | ED | SI | ES | TCK | TE | TI | UE | MX | Output | Function |
| --- | --- | --- | --- | --- | --- | --- | --- | --- | --- | --- |
|    |    |    |    |    |    |    |    |    | DO |    |
| 0  | —  | —  | —  | —  | —  | —  | —  | 0  | 0  | Pass Through |
| 1  | —  | —  | —  | —  | —  | —  | —  | 0  | 1  |    |
| —  | —  | —  | —  | —  | —  | —  | —  | 1  | L1 | Parallel Output |
|    |    |    |    |    |    |    |    |    | SO |    |
| —  | —  | —  | —  | 0  | —  | —  | —  | —  | SO$_0$ | No Change |
| 0  | 1  | —  | 0  | 1  | —  | —  | 0  | —  | 0  | Capture |
| 1  | 1  | —  | 0  | 1  | —  | —  | 0  | —  | 1  |    |
| —  | 0  | 0  | 1  | 1  | —  | —  | —  | —  | 0  | Shift |
| —  | 0  | 1  | 1  | 1  | —  | —  | —  | —  | 1  |    |
| 0  | 1  | 0  | 1  | 1  | —  | —  | 0  | —  | 0  | Compress |
| 0  | 1  | 1  | 1  | 1  | —  | —  | 0  | —  | 1  |    |
| 1  | 1  | 0  | 1  | 1  | —  | —  | 0  | —  | 1  |    |
| 1  | 1  | 1  | 1  | 1  | —  | —  | 0  | —  | 0  |    |
| —  | 0  | —  | 0  | 1  | —  | —  | —  | —  | 0  | Reset |
| —  | 1  | —  | 0  | 1  | —  | —  | —  | 1  | L1 | Feedback |
|    |    |    |    |    |    |    |    |    | TO |    |
| —  | —  | —  | —  | —  | —  | 0  | —  | —  | F1 | TO = F1 ⊕ TI |
| —  | —  | —  | —  | —  | —  | 1  | —  | —  | !F1 |    |
|    |    |    |    |    |    |    |    |    | L1 |    |
| —  | —  | —  | —  | —  | —  | —  | 0  | —  | L1$_0$ | No Change |
| —  | —  | —  | —  | —  | —  | 0  | 1  | —  | F1 | F1 ⊕ TI |
| —  | —  | —  | —  | —  | —  | 1  | 1  | —  | !F1 |    |

The fifty-three input boundary cells comprising the PRPG shown in FIG. 3 are connected together such that the tap output (TO) of cell C1 is provided to the serial input (SI) of cell C2, the TO of cell C2 is provided to the SI of cell C3 and the TO of cell C6 is provided to the SI of cell C7. The output of cell C31, C41 or C53 is fed back to cell C1 by the compare/weights logic to configure the LFSR to implement one of three primitive polynomials, p$^1$(x), p$^2$(x) or p$^3$(x), identified above. The location of feedback taps defines the characteristic polynomial while the number of stages included in the LFSR determines the degree of the polynomial.

FIGS. 5A and 5B provide a schematic diagram of the compare/weights circuit shown in FIG. 2. The logic is organized into three blocks identified by reference numerals 82, 84 and 86. The inputs to these three blocks, identified as signals SOI(1) through SOI(31), SOI~(32) through SOI~(40) and SOI(41) through SOI(53), are the SO outputs of boundary scan cells C1 through C53.

The outputs of logic blocks 82, 84 and 86 are provided to a NAND gate 86 which generates the signal COUNTDONE~. Weighted signals are also generated by the circuit for use by the BIST logic included within the chip.

The logic within block 82 combines signals SOI(1) through SOI(31) to generate three HIGH state signals on conductors 130, 132 and 134 when each of signals SOI(1) through SOI(31) is at a HIGH state. In addition, the combinational logic within block 82 is selected to generate weighted signals W_0.0039, W_0.984, W_0.968, W_0.9375, W_0.875, W_0.875_2 and W_0.75. The number which identifies each of the weighted signals is the probability of the signal being at a HIGH state.

Signal W_0.0039 is produced by combining eight signals, i.e. SOI(2), SOI(4), SOI(7), SOI(11), SOI(16), SOI(22), SOI(27) and SOI(31) within an AND gate 90. As each one of the inputs to gate 90 has a 0.5 probability of being in a HIGH state, the output signal generated by gate 90 has a probability of 0.5$^8$, or 0.0039, of being in a HIGH state. This output signal is also provided to gate 86 via conductor 130.

Seven-input NAND gate 92, six-input NAND gate 94, five-input NAND gate four input NAND gate 96, three-input NAND gates 100 and 102 and two-input NAND gate 104 produce signals W_0.984, W_0.968, W_0.9375, W_0.875, W_0.875_2 and W_0.75, respectively. The output signals produced by gates 92, 94 and 96 are combined by a NOR gate 98 to generate the signal transmitted on conductor 132. Similarly, the output signals produced by gates 100, 102 and 104 are combined by a NOR gate 106 to generate the signal transmitted on conductor 134.

Logic block 84 combines active LOW signals SOI~(32) through SOI~(40) and SOI(41) to generate a HIGH state signal on conductor 137 when each of signals SOI~(32) through SOI~(40) is at a LOW state and signal SOI(41) is HIGH. Signal SEL0 and NAND gate 128 control transmission of this signal to NAND gate 86. The logic also generates four weighted signals W_0.5, W_0.25, W_0.125 and W_0.0625.

Logic block 86 combines signals SOI(42) through SOI(53) to generate a HIGH state signal on conductor 139 when each of signals SOI(41) through SOI(53) is at a HIGH state. Signal SEL1 and OR gate 118 control transmission of this signal to NAND gate 86. The logic also generates three weighted signals W_0.9375_2, W_0.9375_3 and W_0.9375_4.

Compare/weights unit 88 further includes a 4:1 multiplexer 88 responsive to control signals SEL0 and SEL1 to select the feedback signal that determines what primitive polynomial the PRPG unit implements. The feedback signal TOI may be either SOI(53), SOI(41) or SOI(31).

Table 5, shown below, lists and describes the input and output signals for the compare/weights circuit shown in FIGS. 5A and 5B.

TABLE 5

| Compare/Weights Signal Description | |
|---|---|
| Name | Description |
| SEL0 | Selection of LFSR size input |
| SEL1 | Selection of LFSR size input |
| SOI(1:31) | Serial test data output and Inverted Serial test |
| SOI~(32:40) | data for the first 53 cells |
| SOI(41:53) | |
| TOI | Feedback signal for LFSR |
| COUNTDONE~ | Signals end of count |
| W.XXXX | Weighted Signals p(.XXXX) = logic 1 |

TABLE 6

| Compare/Weights Truth Table | | | | | | |
|---|---|---|---|---|---|---|
| SEL0 | SEL1 | SOI(1:31) | SOI~(32:40) | SOI(41:53) | Output | Description |
| | | | | | TOI | |
| 0 | 0 | — | — | — | 0 | Shift |
| 0 | 1 | — | — | — | SOI(31) | LFSR of length 31 |
| 1 | 1 | — | — | — | SOI(41) | LFSR of length 41 |
| 1 | 0 | — | — | — | SOI(53) | LFSR of length 53 |
| 0 | 1 | 7FFFFFFF | — | — | 0 | LFSR 31 count finished |
| 1 | 1 | 7FFFFFFF | 0 | — | 0 | LFSR 41 count finished |
| 1 | 0 | 7FFFFFFF | 0 | 1FFF | SOI(53) | LFSR 53 count finished |

The W_.XXXX signals give a probability [p(.XXXX)] of the weighted random signals being a logic 1.

Together, the input register components described above may be enabled to (1) generate random test patterns, (2) operate as a multiple input signature register, (3) capture incoming signals provided to the input register in either parallel form from the input pads via bus 38 or in serial form from line 40, (4) shift captured values through the register, or (5) count for a desired number of BIST cycles.

Table 2 shows the control signal states and the associated operating modes of the input register. Enable signals ED and ES determine whether the PRPG unit functions as an LFSR, a MISR or to capture and hold data.

The generation of random test patterns and the ability to act as a multiple input signature register are functions of the LFSR implemented in PRPG unit 42. Signals SEL0 and SEL1 select the feedback signal which determines the primitive polynomial employed by the LFSR to generate a random test pattern sequence. Signals SEL0 and SEL1 also enable the logic blocks within compare/weights unit 44 which are necessary to detect the test sequence stop pattern.

Capture and shift operations are basic functions of the individual boundary input cells.

The counting function is realized by preloading the PRPG unit with a starting seed value. The sequence of test patterns generated by PRPG unit 42 is invariable and dependant upon the initial value programmed into the PRPG unit, i.e. the PRPG unit will repeat the same succession of test patterns in every cycle which begins with the same initial feed value. Therefore, the bit configuration of any pseudo-random number in the cycle can be determined for any known initial feed value. The number of patterns generated by the PRPG before an all ones pattern is detected can also be determined by the initial feed value.

For any desired BIST cycle count, a starting seed value can be determined which provides the desired number of counts to reach the all-ones state in the LFSR. An external computer is utilized to calculate the desired seed value. A seed determination program finds the starting seed value by counting backwards from the known ending state of all ones using a model of the reciprical of the LFSR used in the input register. The seed can then be loaded into the PRPG prior to executing BIST operation. The compare/weights unit detects the all ones state and sets signal COUNTDONE~ to a low state to indicate that the count is finished.

Figure 6:
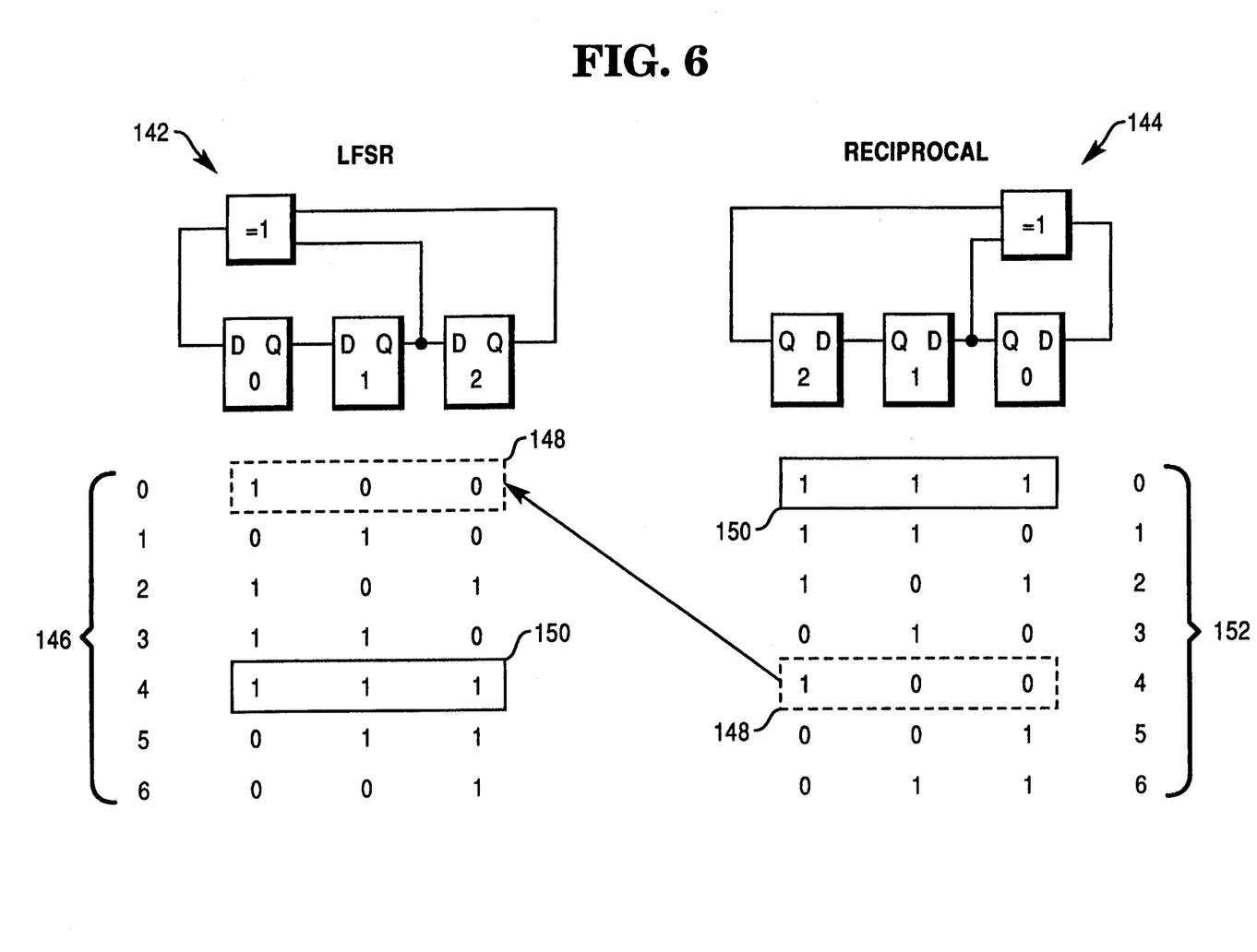
FIG. 6 illustrates the method by which the the start count for the Linear Feedback Shift Register (LFSR) implemented in the PRPG unit is determined.

FIG. 6 provides a simplified illustration of the method by which the start count for the Linear Feedback Shift Register (LFSR) implemented in the PRPG unit is determined. FIG. 6 shows a three-stage LFSR 142 which is configured to generate the three-bit pseudo random data pattern sequence identified by reference numeral 146. In the example illustrated it is desired to preload the LFSR with a start or seed value 148 which will produce a sequence of four data patterns until the stop pattern 150, an all-ones pattern, is generated.

A model 144 of the reciprical of LFSR 142 is shown in FIG. 6. Model 144 generates a pseudo random data pattern sequence 152 which is the inverse of sequence 146. Model 144 is programmed into an external computer (not shown) and the seed value 148 determined by counting from an initial all-ones data pattern 150 for four cycles. The pattern produced after four cycles is the seed value for LFSR 142.

It can thus be seen that there has been provided by the present invention an improved input register for an integrated circuit. In addition to controlling signal transmission from the IC input pads to the IC internal logic, the input register provides BIST functionality including the generation of pseudo random test patterns and the generation of weighting signals. The input register may also function as a multiple input signature register or as a counter.

Although the presently preferred embodiment of the invention has been described, it will be understood that various changes may be made within the scope of the appended claims.

What is claimed is:

1. An input register for an integrated circuit, said integrated circuit including a plurality of input pads and an internal logic block, said input register comprising:

a programmable polynomial function generator for generating successive pseudo random data patterns to be supplied to said internal logic block, said programmable polynomial function generator implementing a polynomial to determine a sequence for the successive pseudo random patterns; and logic circuitry connected to receive the output of said programmable polynomial function generator for selecting a feedback signal to be provided back to said programmable polynomial function generator to select a characteristic polynomial and a polynomial bit length to be implemented by said programmable polynomial function generator.

2. The input register according to claim 1, further comprising:

compare logic circuitry connected to receive the output of said programmable polynomial function generator for generating a stop count signal upon the receipt of a predetermined bit pattern from said polynomial function generator.

3. A method for determining a selectable seed value for a linear feedback shift register (LFSR) configured to generate a first known succession of pseudo random data patterns, said selectable seed value producing a predetermined stop pattern at the conclusion of a predetermined number of count cycles, said method comprising the steps of:

forming a computer model of the reciprocal of said LFSR for generating a second succession of pseudo random data patterns, said second succession being the inverse of said first succession; and counting through said second succession of pseudo random data patterns beginning with said predetermined stop pattern for said predetermined number of count cycles to arrive at said selectable seed value.

4. In an input register for an integrated circuit, said input register comprising a plurality of input cells connected together to form a pseudo random pattern generator and means connected to receive said pseudo random data for generating a stop count signal upon the receipt of a predetermined stop pattern, a method for generating a predetermined number of pseudo random data patterns, said method comprising the steps of:

determining a start value required to produce said predetermined number of pseudo random data patterns concluding with said predetermined stop pattern, said step of determining said start value including the steps of:

forming a computer model of the reciprocal of said LFSR for generating an inverse succession of pseudo random data patterns;

counting through said inverse succession of pseudo random data patterns beginning with said predetermined stop pattern for said predetermined number of pseudo random data patterns to arrive at said start value; and preloading said LFSR with said start value.

* * * * *